(12) United States Patent
Lumsdaine et al.

(10) Patent No.: US 8,775,495 B2
(45) Date of Patent: Jul. 8, 2014

(54) COMPRESSION SYSTEM AND METHOD FOR ACCELERATING SPARSE MATRIX COMPUTATIONS

(75) Inventors: Andrew Lumsdaine, Bloomington, IN (US); Jeremiah Willcock, Livermore, CA (US)

(73) Assignee: Indiana University Research and Technology, Indianapolis, IN (US)

( * ) Notice: Subject to any disclaimer, the term of this patent is extended or adjusted under 35 U.S.C. 154(b) by 866 days.

(21) Appl. No.: 11/673,944

(22) Filed: Feb. 12, 2007

(65) Prior Publication Data

US 2007/0198621 A1 Aug. 23, 2007

Related U.S. Application Data

(60) Provisional application No. 60/773,039, filed on Feb. 13, 2006.

(51) Int. Cl.
*G06F 7/32* (2006.01)
*G06F 7/52* (2006.01)
*H03M 7/30* (2006.01)
*G06F 17/16* (2006.01)

(52) U.S. Cl.
CPC *G06F 17/16* (2013.01); *H03M 7/30* (2013.01)
USPC .......................................... 708/520; 708/607

(58) Field of Classification Search
CPC ....................................................... G06F 17/16
USPC .................................................. 708/520, 607
See application file for complete search history.

(56) References Cited

U.S. PATENT DOCUMENTS

| | | | | |
|---|---|---|---|---|
| 4,914,615 A | * | 4/1990 | Karmarkar et al. | 708/607 |
| 5,206,822 A | * | 4/1993 | Taylor | 708/607 |
| 5,267,185 A | * | 11/1993 | Akabane et al. | 708/520 |
| 5,781,779 A | * | 7/1998 | Gilbert et al. | 717/147 |
| 5,905,666 A | * | 5/1999 | Hoffman et al. | 700/99 |
| 6,243,734 B1 | * | 6/2001 | Doshi et al. | 708/607 |
| 2002/0161812 A1 | * | 10/2002 | Doshi et al. | 708/607 |

* cited by examiner

*Primary Examiner* — Chuong D Ngo
(74) *Attorney, Agent, or Firm* — Faegre Baker Daniels

(57) ABSTRACT

The present invention involves a sparse matrix processing system and method which uses sparse matrices that are compressed to reduce memory traffic and improve performance of computations using sparse matrices.

22 Claims, 5 Drawing Sheets

COMPRESSION SYSTEM AND METHOD FOR ACCELERATING SPARSE MATRIX COMPUTATIONS

This application claims the benefit of U.S. Provisional Patent Application Ser. No. 60/773,039 filed Feb. 13, 2006, the complete disclosure of which is hereby expressly incorporated by reference.

BACKGROUND OF THE INVENTION

1. Field of the Invention

The invention relates to computer software. More specifically, the field of the invention is that of computer software for efficiently performing computations with sparse matrices.

2. Description of the Related Art

Sparse matrices play an important role in the numerical solution of many scientific problems. For example, many problems in physical modeling, such as simulating the aerodynamics of aircraft wings, involve the solution of partial differential equations. The finite element method for this problem uses sparse matrices to represent the interactions between parts of the problem domain. In addition, sparse graphs used to model relationships between entities, such as modeling the links between pages on the World Wide Web, are often represented as sparse adjacency matrices (aka matrix patterns).

Algorithms to solve these problems often use matrix-vector multiplication as a principal operation; when sparse matrices are used, the operation is usually multiplying a sparse matrix by a dense vector. This disclosure describes a technique (matrix pattern compression) and two implementations of it to improve the performance of matrix-vector multiplication using large matrices on standard microprocessors.

As has been shown by Gropp and others, the main performance bottleneck for matrix-vector multiplication for large matrices on modern architectures is memory bandwidth (See W. Gropp, D. Kaushik, D. Keyes, and B. Smith. "Toward realistic performance bounds for implicit CFD codes" In A. Ecer et al., editors, Proceedings of Parallel CFD'99. Elsevier, 1999). In a matrix-vector multiplication, each element of the matrix is only used once. If the matrix is larger than the system's caches, the entire matrix must be loaded from main memory for each multiplication, and so the bandwidth of main memory becomes the main performance limitation. In modern microprocessor-based systems, the rate at which floating point operations can be conducted exceeds the memory bandwidth by a factor of ten or more. Thus, a method that could reduce the required memory traffic for matrix-vector multiplication could improve performance overall, even if some additional computation may be required.

The main data structure used currently for sparse matrix index data is compressed sparse row (CSR). The data structure used for CSR is shown in FIG. 1. An array of row positions contains the index of the beginning of each row within arrays of column numbers and data. The row of each element in the matrix never appears explicitly in the data structure. As elements in the same row are often located in nearby columns, the CSR representation contains a lot of redundant information. In particular, the column numbers within each row are sorted, and are often close to each other. Thus, using four bytes to represent each column number is highly inefficient, as the first three of those bytes are often the same between several elements in a row. Similarly, the same or similar column numbers are often used in nearby rows of a matrix, leading to more redundant information. This disclosure explains two compression schemes which remove some of this redundant index information, while still allowing a fast multiplication algorithm.

Although previous work, such as that in the work of Blandford and Blelloch (See D. K. Blandford, G. E. Blelloch, and I. A. Kash "Compact representations of separable graphs" In Proc. ACM-SIAM Symposium on Discrete Algorithms, 2003; and D. K. Blandford, G. E. Blelloch, and I. A. Kash "An experimental analysis of a compact graph representation", 2004), provides other forms of compression that are applicable to sparse matrix patterns, those compression schemes do not provide fast matrix-vector multiplication on modern microprocessors. In particular, the compressed formats in this disclosure provide multiplication operations whose speedups are generally proportional to the total compression ratio. The PageRank algorithm (See L. Page, S. Brin, R. Motwani, and T. Winograd "The PageRank citation ranking: Bringing order to the Web" Technical report, Stanford Digital Library Technologies Project, November 1998) is based on a power-method computation of the principal eigenvalues of a sparse matrix and includes multiplication with an adjacency matrix as its fundamental operation. Implementation of Page Rank with Blandford et al's compressed graphs was beneficial on the Intel Pentium III but had a loss in performance relative to using compressed sparse row format on the Intel Pentium 4, as reported in the second one of the above referenced Blandford and Blelloch papers. Their work also does not consider the effect of compression time on overall application performance.

SUMMARY OF THE INVENTION

The present invention is a sparse matrix processing system and method which allows for enhanced processing of sparse matrices by storing the matrices in a compressed format that reduces memory traffic and improves overall computational performance when the matrix is used for a computation.

Sparse matrix computations are important for many scientific computations. In particular, matrix-vector multiplication is used in many numerical methods used to solve simulation problems, especially multiplying the same matrix by many vectors in sequence. One major constraint on the performance of this operation on modern computers is limited memory bandwidth for loading matrix data from main memory. The present invention includes two compressed formats for the pattern of a sparse matrix which allow the amount of memory bandwidth used for multiplication to be reduced substantially, without affecting correctness. Fast algorithms for compressing and decompressing/multiplying matrices using these formats enhance the performance improvements. These compressed formats are designed to be used in an efficient multiplication algorithm, and empirical tests show that they indeed have a performance benefit. These results also show that using matrices compressed in these formats is beneficial for overall application performance, even when the time for compressing the matrices is considered, as long as similar matrix patterns are used for a reasonable number of multiplications.

The present invention includes two alternative methods to increase the performance of repeated multiplications of a large sparse matrix by a dense vector (in the rest of this disclosure, unless otherwise specified, matrices are always sparse and vectors are always dense). The technique used in both methods is to compress the index data of the matrix so that the multiplication operation transfers less data from main memory to the CPU, causing a performance increase in the overall multiplication operation. Because numerical methods using sparse matrices, such as iterative solvers for systems of linear equations, multiply the same matrix by many vectors in sequence, the time needed to compress the matrix may be amortized over the time savings from several multiplications. The compression does not change the number of floating-point arithmetic operations performed in matrix-vector multiplication, but it does cause some local rearrangement of those operations, and increases the number of integer operations and possibly the number of branches relative to using previous sparse matrix formats.

Both compression system embodiments have three main steps for use: applying a compression algorithm to compress the matrix index data, storing it in the compressed format thus produced, and then using a merged decompression/matrix-vector multiplication algorithm on the compressed data and a vector to cause improved performance for this operation. Neither compression scheme here changes the numerical values stored in the matrix—they are stored in exactly the same order and precision as in CSR format, and no new values are added. Because of the assumption that the same matrix will be multiplied by many vectors, compression takes longer than decompression, but the time saved by faster matrix-vector multiplications usually makes up for the compression time. The decompressed matrix data is never stored into memory by the decompression algorithms, as writing this data to memory would defeat the purpose of using compressed matrices in the first place: to reduce the amount of data transferred to and from memory. Therefore, decompression is done incrementally as part of the matrix-vector multiplication; other operations may also be implemented for compressed matrices in the future.

Further aspects of the present invention involve a method of improving the processing of sparse matrices by a computer system having a predefined memory bandwidth. Sparse matrices are stored in a compressed format that reduces memory traffic and improves overall computational performance when the matrix is used for a computation. The sparse matrices are accessed from the memory and decompressed into a format for performing operations. The sparse matrix data then have operations performed using them in the decompressed format (the decompressed data not being stored back to memory). The operations may involve page ranking, creating images, inverted indexes, graphs, and/or matrix-vector multiplication.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein.

Figure 1:
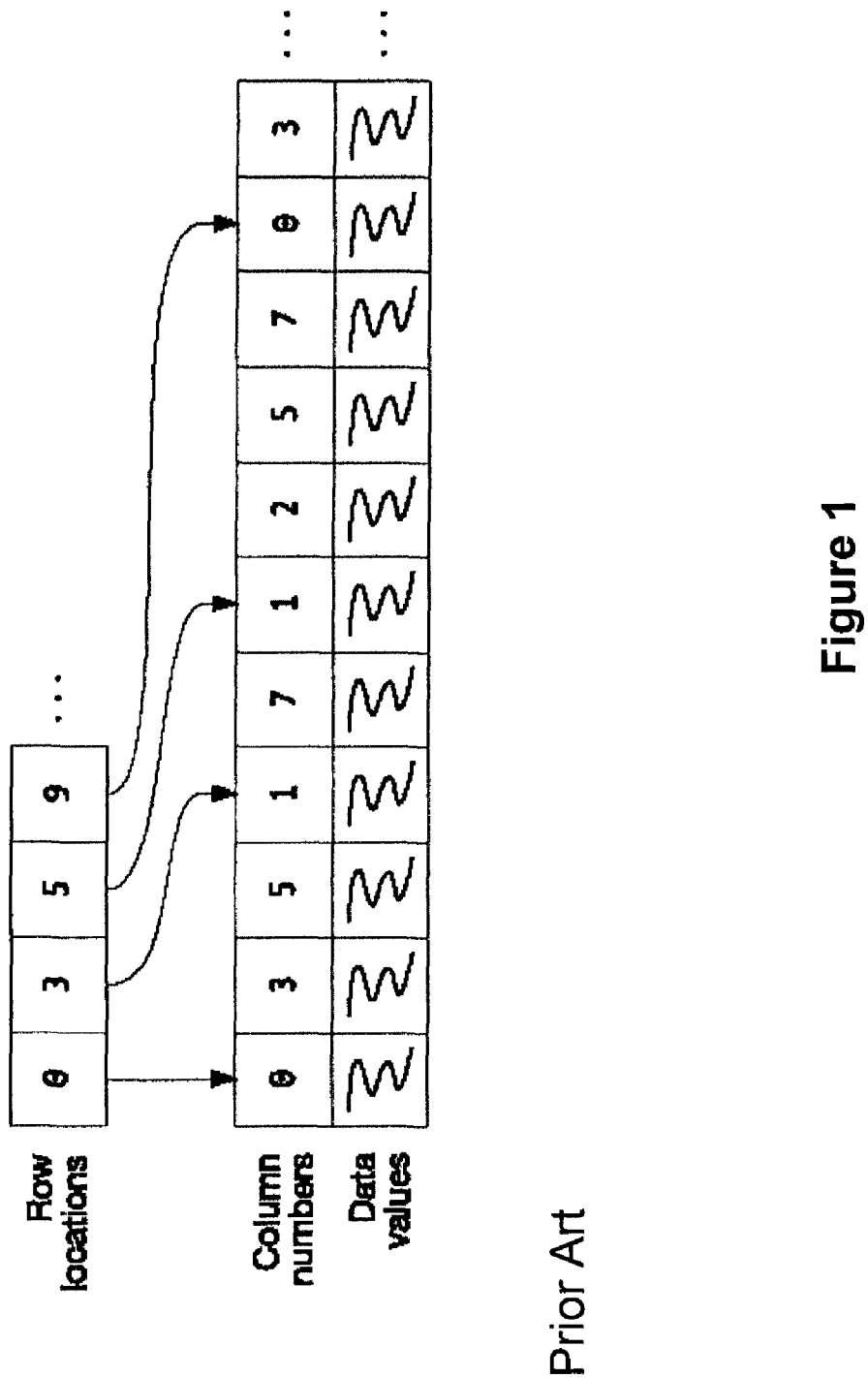
FIG. 1 is a schematic diagrammatic data model view of a compressed sparse row data structure of the Prior Art.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DESCRIPTION OF THE PRESENT INVENTION

The embodiment disclosed below is not intended to be exhaustive or limit the invention to the precise form disclosed in the following detailed description. Rather, the embodiment is chosen and described so that others skilled in the art may utilize its teachings.

The detailed descriptions which follow are presented in part in terms of algorithms and symbolic representations of operations on data bits within a computer memory representing alphanumeric characters or other information. These descriptions and representations are the means used by those skilled in the art of data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, symbols, characters, display data, terms, numbers, or the like. It should be borne in mind, however, that all of these and similar terms are to be associated with the appropriate physical quantities and are merely used here as convenient labels applied to these quantities.

Some algorithms may use data structures for both inputting information and producing the desired result. Data structures greatly facilitate data management by data processing systems, and are not accessible except through sophisticated software systems. Data structures are not the information content of a memory; rather they represent specific electronic structural elements which impart a physical organization on the information stored in memory. More than mere abstraction, the data structures are specific electrical or magnetic structural elements in memory which simultaneously represent complex data accurately and provide increased efficiency in computer operation.

Further, the manipulations performed are often referred to in terms, such as comparing or adding, commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers, special-purpose digital devices (e.g., based on ASICs or FPGAs), or other similar devices. In all cases the distinction between the method operations in operating a computer and the method of computation itself should be recognized. The present invention relates to a method and apparatus for operating a computer in processing electrical or other (e.g., mechanical, chemical) physical signals to generate other desired physical signals.

The present invention also relates to an apparatus for performing these operations. This apparatus may be specifically constructed for the required purposes or it may comprise a general purpose computer as selectively activated or reconfigured by a computer program stored in the computer. The algorithms presented herein are not inherently related to any particular computer or other apparatus. In particular, various general purpose machines may be used with programs written in accordance with the teachings herein, or it may prove more convenient to construct more specialized apparatus to perform the required method steps. The required structure for a variety of these machines will appear from the description below.

In the following description, several terms which are used frequently have specialized meanings in the present context. The term "sparse matrix" refers to a matrix where the vast majority (usually at least 99% for large matrices) of the element values are zero. The number of nonzero elements in a given matrix is denoted by NNZ. Matrices with this property may be stored much more efficiently in memory if only the nonzero data values are stored, as well as some index data to identify where those data values fit in the matrix. The information, about which elements in the matrix are nonzero, without their actual values, is called the pattern of the matrix; the index data stored in a representation of the matrix describes the pattern in a compact format, separately from the values of the nonzero elements. Many storage formats have been developed for this purpose, including coordinate form, compressed sparse row, and variable block row (See Z. Bai, J. Demmel, J. Dongarra, A. Ruhe, and H. van der Vorst, editors. "Templates for the Solution of Algebraic Eigenvalue Problems: a Practical Guide" SIAM, 2000, Section 10.2).

Figure 5:
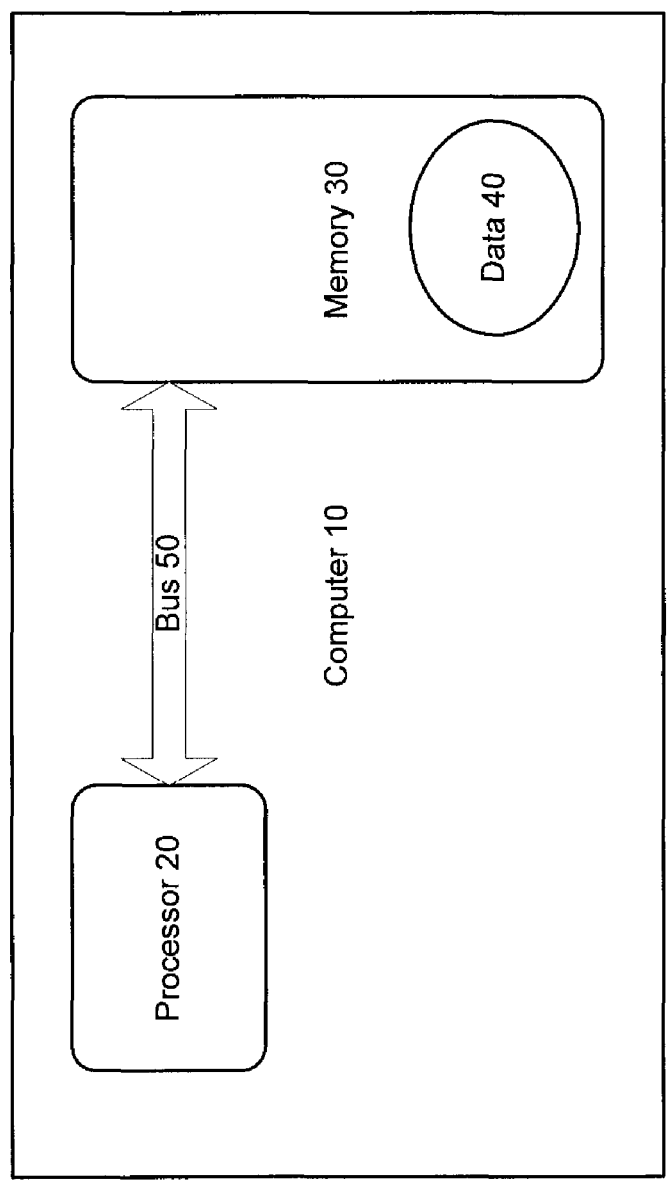
FIG. 5 is a schematic diagram of a computer using the techniques of the present invention.

The method of the present invention may be utilized in a computer system as shown in FIG. 5. Computer 10 has a processor 20 and memory 30. Processor 20 obtains data 40 to perform operations upon via bus 50. Data 40 may be stored in a variety of different formats or structures. For example, a sparse matrix may be stored as a collection of bits, the vast majority of which are zeroes. Alternatively, a sparse matrix may be stored in a format that has a plurality of record blocks representing portions of the sparse matrix. Bus 50 may have the ability to obtain a variety of sizes of data, and conventionally such sizes are binary multiples. In accordance with the present invention, the format or structure of data 40 in which a sparse matrix is stored results in smaller data size that must be transferred over bus 50. While the exemplary embodiment of the invention is described in terms of a data bus within a single computer, the present invention also includes embodiments where multiple computers solve computational problems over networks and telecommunications lines, where the bandwidth of the communications medium is the limiting performance factor.

In the following disclosure, the theoretical peak performance of both prior art CSR and compressed matrix representations of the present invention for matrix-vector multiplication are compared using the framework of Gropp et al. In this model, main memory bandwidth is assumed to be the only limiting factor on multiplication performance, and that the system caches contain any data that was loaded at least once during the multiplication. This performance analysis assumes a square, n×n matrix with a 0.5% density ratio. This matrix then has nnz=$n^2$/200 nonzero elements. It is assumed that an integer is four bytes and a floating-point value is eight bytes. One multiplication of this matrix by a vector then involves 2nmz (or $n^2$/100) floating point operations. Given this, the number of floating point operations per byte of memory traffic may be used to approximate the peak performance available for the multiplication operation. The numerical values for an unsymmetric matrix normally take 8nmz or $n^2$/25 bytes, both for CSR and our compressed formats. While this framework worked well for the particular circumstances of the disclosed embodiment of the invention, other frameworks, assumptions, and criteria may be used for other embodiments within the teaching of the present invention.

Figure 2:
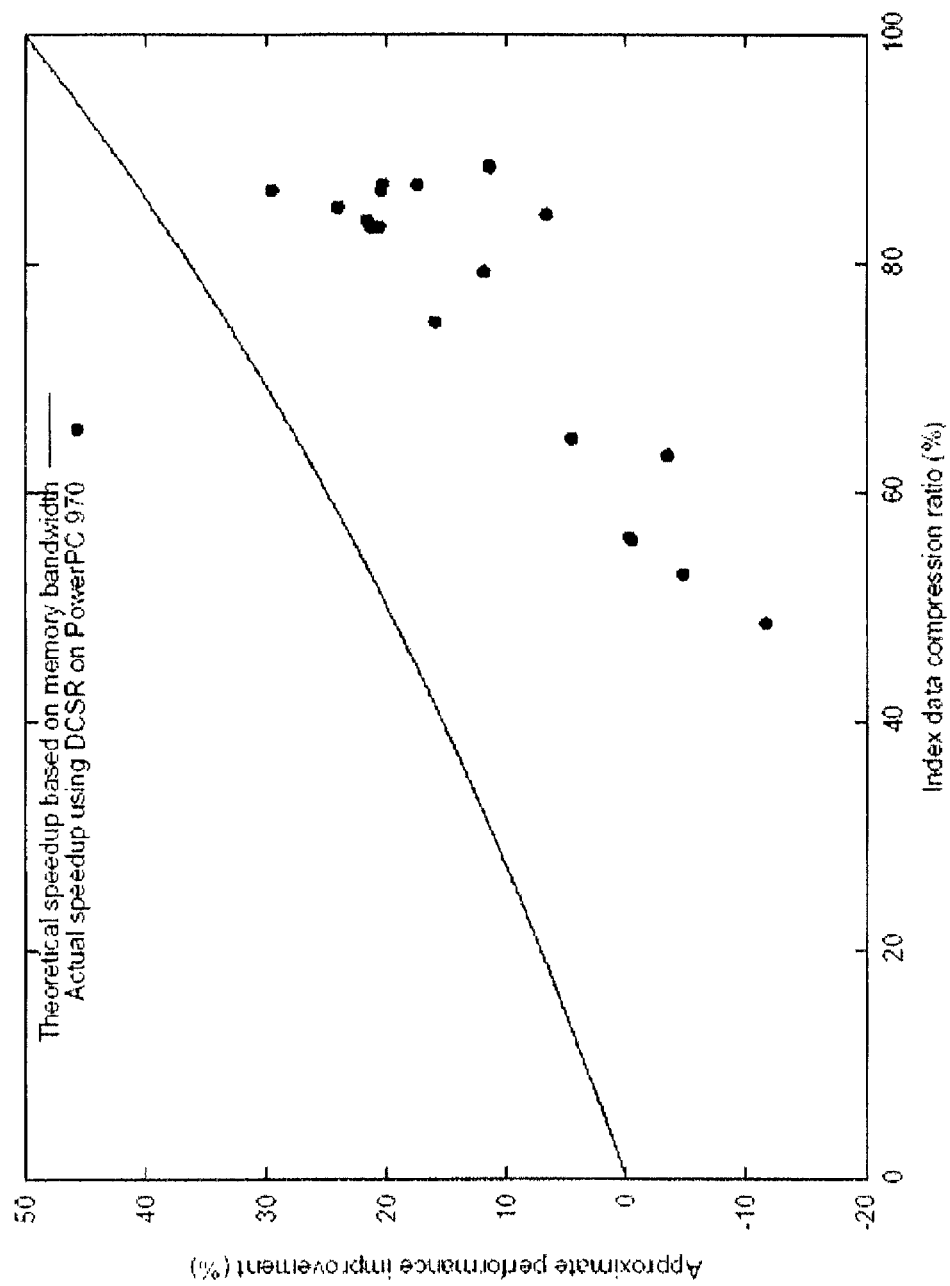
FIG. 2 is a graph diagram of asymptotic performance improvement for large matrices, based on index data compression ratio; dots represent actual performance behavior of test matrices using simple delta-coding compression on PowerPC 970.

For CSR, the index data of the matrix is stored using 4n+4nmz or 4n+$n^2$/50 bytes of memory, for a total of 4n+3$n^2$/50 bytes of memory. The vectors involved in the multiplication require 24n bytes of memory traffic: operation y=y+Ax needs both x and y to be loaded into the CPU and y to be stored back into main memory; each vector contains 8n bytes of data. Adding in the 24n bytes of memory traffic for the vector data, a multiplication by the CSR form of the matrix requires 28n+3$n^2$/50 bytes of memory traffic for $n^2$/100 floating-point operations. Therefore, asymptotically, 1/6 floating point operation may be done per byte of memory traffic. Using a compression scheme with an index compression ratio of 1-r (i.e., one byte of CSR index data becomes r bytes of compressed index data), the index data takes only 4rn+r$n^2$/50 bytes, for total data traffic of (24+4r)n+(2+r)$n^2$/50 bytes. The number of floating point operations remains the same, so 1/(4+2r) floating-point operations may be done (asymptotically) per byte of memory traffic. Thus, as r approaches zero, a 50% performance increase is possible, assuming that memory bandwidth is the limiting performance factor and that the matrix is large enough. With an index compression ratio of 5/6 (i.e., r=1/6), which is more practical, the resulting peak speedup is about 38%. FIG. 2 shows a graph of performance improvement vs. compression ratio as predicted by this model, as well as data points for one compressed format on the IBM PowerPC 970 on a set of test matrices.

For empirical results, the performance and compression obtainable from the two compression methods were tested on two platforms: IBM PowerPC 970 and AMD Opteron. The PowerPC system is an Apple Power Mac G5, with two 2.0 GHz PowerPC 970 processors (of which one was used for experiments) and 3.5 GB of RAM. The operating system is Mac OS X 10.3.9, and the compiler is IBM xlc++ version 6.0, with the optimization flags-qarch=ppc970-O5 and NDEBUG defined. Because the DCSR multiplication code uses g++-specific features, version 3.3 20030304 (Apple Computer, Inc. build 1671) of it was used, with the optimization flags-mcpu=970-mpowerpc64-mpowerpc-gfxopt-mpowerpc-gpopt-Drestrict=_restrict_-O3-ffast-math and NDEBUG defined. The Opteron systems used have dual AMD Opteron 246 processors running at 2.0 GHz (of which one was used) and 4 GB of memory. They are running Gentoo Linux version 1.4.16, with kernel version 2.6.9. The compiler used is g++ version 4.0.1, with the optimization flags-O3—param large-function-growth=1000—param max-inline-insns-auto=450—param max-inline-insns-single=4500—param inline-call-cost=40-m64-Drestrict=_restrict_-mfpmath=sse-ffast-math-march=opteron-msse2 and NDEBUG defined. The matrices used are from the Matrix Market (http://math.nist.gov/MatrixMarket/) and the University of Florida sparse matrix collection (http://www.cise.ufl.edu/research/sparse/matrices/), and were chosen as representative of the types and sizes of matrices that are likely to be used to solve real problems. The implementations of the benchmark software and compression algorithms support double-precision real symmetric and unsymmetric matrices, with separate storage for the diagonal of a symmetric matrix (as in modified sparse row format); unsymmetric adjacency matrices (with all nonzero elements equal to one) are also supported. Some basic information about the test matrices is given in Table 1.

In the tables of performance results, the columns "Index cmp." and "Total cmp." refer to the index and total compression ratios for the matrix, respectively. The "Exp. spd." column gives the speedup predicted by the model in Gropp et al. based on each matrix's index compression ratio. The "Speedup" column gives the percentage of performance improvement (in number of multiplications per unit time) relative to a CSR matrix-vector multiplication algorithm. The "Tradeoff" column indicates how many multiplications by the same matrix are required to fully amortize the compression time (i.e., such that the time savings from using a compressed matrix for multiplication outweighs the time used to compress the matrix).

One successful compression scheme is to encode the differences between the column positions of nonzero elements in one row of a matrix (a form of delta coding) using the minimum number of bytes possible. In addition, this compression scheme provides a form of run-length encoding (encoding nonzero elements in consecutive positions as a single entity) to compress several adjacent nonzero elements more effectively. This format is relatively simple and fast to compress into. Also, the decompression and matrix-vector multiplication code for this format is simple and fast. This format is referred to as DCSR, for delta-coded sparse row. The format also has the benefit that it may be used (with a small modification) for matrices whose patterns change during a computation, either by adding or deleting nonzero elements. Allowing modifications to the stored pattern requires storing each row of the matrix separately so that they may be expanded and contracted, as is also required for dynamic pattern modification for matrices in CSR format.

The DCSR compressed matrix format encodes the matrix using a set of six command codes, where each command code takes a single byte argument; one command code does not use its argument. The compressed matrix pattern may then be viewed as a list of (command code, argument) pairs. Three of these pairs are encoded into a 32-bit word, forming a word-code for representing sparse matrix patterns. The highest byte of each word contains a base-six representation of the command codes. Values above $6^3=216$ are used for special purposes: the value 255 represents the end of the matrix; other values are abbreviations used to speed up decompression. The three lower bytes contain the arguments of the three commands.

Because of the need to amortize branch costs across several matrix elements, abbreviations for pairs of common command bytes (groups of six command codes) were implemented. Although the pairs of command bytes to be abbreviated were chosen based on the matrices used for performance testing, the patterns they encode are not particular to these matrices. Most of the abbreviations speed up the decompression of matrices which are very sparse, and so have long gaps between consecutive nonzero elements. Thus, they are not really particularly targeted to the test matrices, and will likely benefit other matrices used in applications. Dynamic code generation could be used to create a custom set of abbreviations for each particular matrix during the compression process, which would improve performance further in some cases. Note that because of the fixed format of each word, the abbreviations provide no compression ratio benefit.

The format may be best visualized by thinking of a decompression process which streams nonzero matrix element positions to some other process using the emit_element( ) procedure. The decompressor has variables for the current row and column col of the matrix, and an accumulator acc to allow values larger than one byte to be represented. All of these variables are initialized to zero upon starting decompression. (In this application, indexing is assumed to be zero-based). The command codes then result in the following operations, assuming the command's argument byte is named arg:

```
0: acc = acc * 256 + arg;
1: col = col + acc * 256 + arg; acc = 0;
1: emit_element(row, col); col = col + 1;
2: col = col + acc * 256 + arg; acc = 0;
2: emit_element(row, col);
2: emit_element(row, col + 1); col = col + 2;
3: col = col + acc * 256 + arg; acc = 0;
3: emit_element(row, col);
3: emit_element(row, col + 1);
3: emit_element(row, col + 2); col = col + 3;
4: col = col + acc * 256 + arg; acc = 0;
4: emit_element(row, col);
4: emit_element(row, col + 1);
4: emit_element(row, col + 2);
4: emit_element(row, col + 3); col = col + 4;
5: row = row + 1; col = 0;
```

Figure 3:
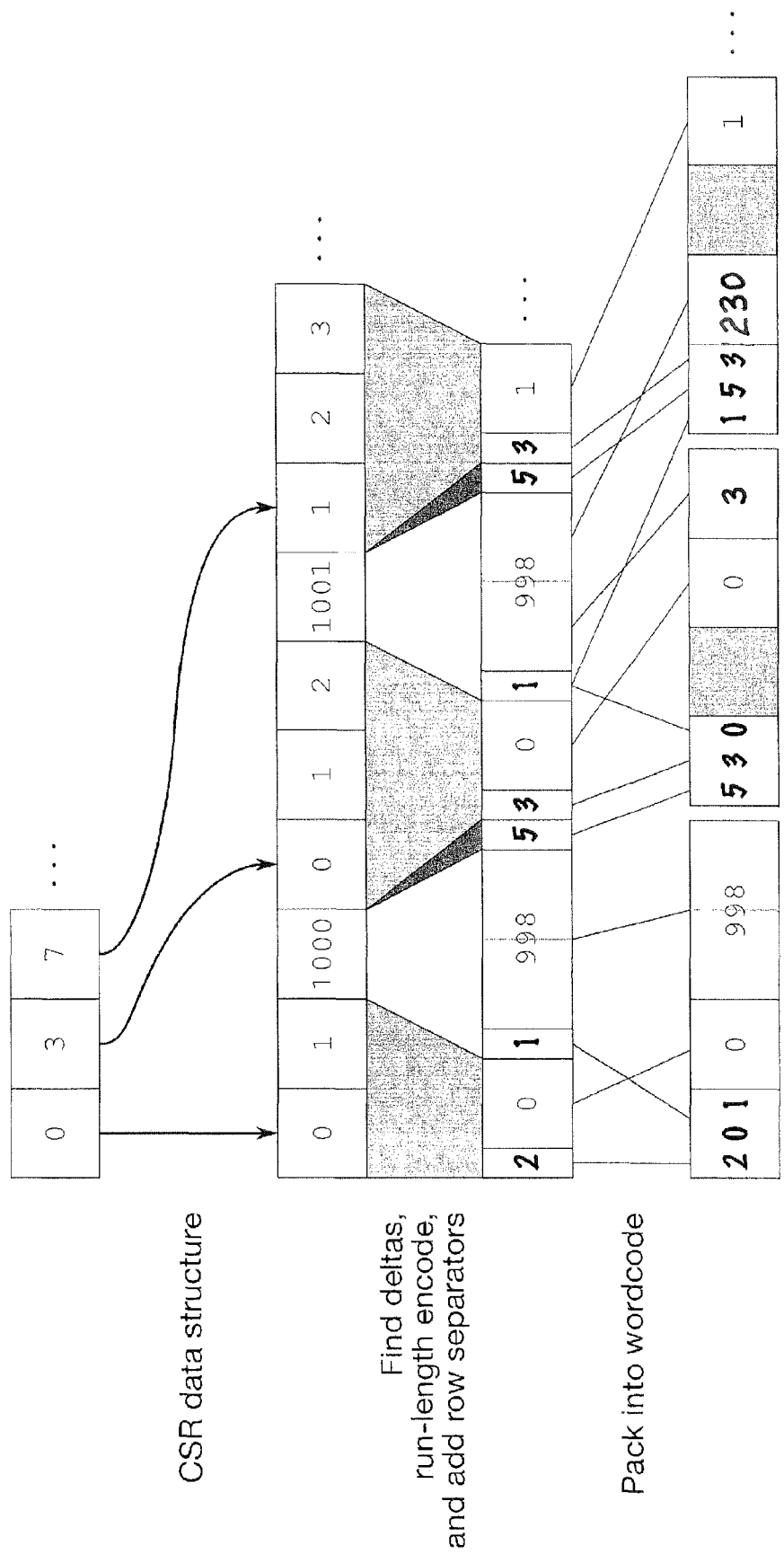
FIG. 3 is a schematic diagrammatic data model view showing the beginning of the pattern of the bwm2000 matrix, showing the compression process from CSR form to DCSR form.

As an example of this form of compression, the first few rows of the bwm2000 matrix from the Matrix Market collection are shown in both CSR and delta-coded form in FIG. 3. Lines in the figure indicate the corresponding parts of the encoded data in successive parts of the compression algorithm.

Compressing the pattern of a sparse matrix into this format is straightforward: the command codes and argument bytes for the matrix are generated and packed into words in a single pass. The compression process follows the structure of the matrix in CSR format. An outer loop processes each row separately, inserting the command code 5 between rows. Within a row, each group of up to four adjacent nonzero elements is processed separately. The difference between the position of this group and the previous one (or the left side of the matrix in the case of the first group in each row) is encoded using zero or more instances of command code 0 (to place all but the last byte of the delta value into the accumulator) and the command for the size of the group (to finish the delta value and indicate the length of the run). The commands and their arguments are then packed into words (with three commands per word), and abbreviations are inserted. Commands from multiple rows can be packed into a single word.

Multiplying a matrix in this format by a vector is much simpler than compressing it. Each word in the compressed index data of the matrix is processed separately, with only row, col, and acc kept between words. The combination of the high byte of the word (the three command codes or abbreviation) and whether the accumulator is nonzero is used to dispatch to specialized decompression code. This code processes the three commands (or six in the case of an abbreviation), using argument bytes and the values of the matrix's nonzero elements as needed. Decompression thus requires an essentially random sequence of multi-way branches, but the cost of each is amortized over several matrix elements in most cases.

This form of compression was implemented on both the IBM PowerPC 970 and AMD Opteron platforms. The compression routine is written in portable C++, and directly implements the algorithm described above. Decompression and matrix-vector multiplication routines are more highly tuned: the PowerPC version is written in nonportable C++, and the Opteron version is written in assembly language.

Both versions are generated automatically by programs written in Tcl. This level of tuning was necessary because a portable version of the multiplication code did not produce high-performance compiled code. Once the code was fully tuned, however, most matrices had improved multiplication performance.

Because this compression algorithm is so simple, compression is very fast. Thus, only a few (approximately 20-40 or so) multiplications by the same matrix are usually needed for compression to improve total computation time. The compression ratios and performance effects of this form of compression are in Tables 2 and 3. The results shown in these tables are based on implementations optimized for each platform, and so some implementation parameters may be different between the platforms. The compressed sparse row implementation is straightforward, and tuned implementations may perform better than the one used here.

Another, more complicated, compression scheme was able to compress matrices more effectively and produce better multiplication performance than simple delta-coding, but at the cost of a much higher compression time. In this format (referred to as RPCSR, for row pattern compressed sparse row), particular delta values between consecutive nonzero elements are abstracted into intervals, and groups of these values are used as the basic unit for compression. As these patterns may be combined through interval union, a small list of them may be created for each matrix. Given this, the matrix's index data is representable by a list of choices from the set of groups, along with arguments for each group: the positions of each particular delta value within its corresponding interval. Code generation is then used to provide a customized decompression and multiplication algorithm for a particular set of groups. This provides a compressed matrix encoding which may produce very good compression ratios and multiplication times for structured matrices, but may gracefully degrade for matrices with essentially random element positions.

However, there is a high compression time required for this format, and access to the index data for the entire matrix is needed during compression. With appropriate choices of parameters for the compression algorithm, and a fast method of run-time code generation, this scheme may be a profitable method for decreasing overall time-to-solution for most kinds of matrices.

The basic unit of a compressed matrix in this format consists of the index of a group (from a list created for each matrix) and a list of words containing its arguments (the positions of the particular delta values from that part of the matrix within the intervals given by the group). In this compressed format, arbitrary intervals could be used to abstract ranges of delta values within a pattern, but this leads to many groups being generated initially and a large amount of time needed to reduce the set of possible groups to a usable size. Thus, a small list of acceptable intervals was chosen for use in the compression algorithm:

| Name | Interval | Argument size |
|---|---|---|
| constant_1 | [1, 1] | 0 bits |
| constant_2 | [2, 2] | 0 bits |
| constant_3 | [3, 3] | 0 bits |
| constant_4 | [4, 4] | 0 bits |
| one_byte | [0, 255] | 8 bits |
| two_bytes | [0, 65,535] | 16 bits |
| three_bytes | [0, 16,777,215] | 24 bits |
| four_bytes | [0, 4,294,967,295] | 32 bits |

A group is then a list of intervals, with a limit (currently 32) on the group length in order to reduce the number of groups generated initially from the matrix pattern. Each group also contains flags indicating its row position (whether it is at the beginning and/or end of a matrix row), for use in generating decompression code. These particular intervals were chosen because of the ease of encoding and decoding arguments; the constant values provide a level of run-length encoding for consecutive and near-consecutive nonzeros in the matrix.

Overall, the index data for a matrix compressed in this format consists of a list of groups (as an explicit list and/or custom decompression code); a list of indices into the list of groups (representing the best group for encoding each part of the matrix); and a list of zero or more argument words for each entry in the index list, in a format which depends on the particular pattern corresponding to that index. The matrix data is stored in the same order as for CSR, as compression does not change the number or order of nonzero elements.

As each pattern is a list of intervals and a row position, two groups of the same length and row position may be merged by merging corresponding pairs of intervals. Two intervals may be merged by taking their union, and then generalizing the resulting interval to the smallest enclosing interval in the set of acceptable intervals. For example, to merge one_byte=[0, 255] and two_bytes=[0, 65535], their union [0, 65535] is first computed; this is already an acceptable interval, named two_bytes. To merge constant_1=[1, 1] and constant_2=[2, 2], their union [1, 2] is generalized to the smallest enclosing acceptable interval [0, 255] (or one_byte). Merging two groups has an associated cost in argument storage: the combined group's intervals are supersets of those in the source groups, and more argument storage may be required for the combined group than the source groups required. Thus, a cost for each pair of groups is defined as the difference in argument storage required by the combined group and the argument storage required by the source groups, with the amount of storage for each group weighted by the number of times it occurs in the matrix. The cost may also have an extra component to penalize merges which increase the number of argument words used for a group, as each group uses an integral number of words for efficiency. The goal of setting the cost function is to encourage merges of infrequently occurring groups, in order to reduce the number of argument words used for the final matrix.

As a matrix often initially has more initial groups than may be encoded in a small index (or may have code generated for decompressing them fit into the processor's instruction cache), an algorithm is used to reduce the set of groups until it is small enough. The algorithm is as follows:

```
threshold = initial threshold;
while (group count > max group count) {
    try to find groups i and j such that merge cost(i, j) ≤ threshold;
    if (such a pair of groups exists) {
        merge groups(i, j);
    } else {
        if (group count ≤ max group count) {
            decompression code = generate code(group set);
            generated code size = size(decompression code);
            if (generated code size < code size limit) break;
        }
        increase threshold;
    }
}
```

In this algorithm, max group count is usually set to 255 to allow either a group index or the end-of-matrix code to be encoded in one byte. The code size limit is usually either the size of the processor's instruction cache or some small multiple of it. The initial threshold and strategy for increasing the threshold may be varied to trade off the amount of time taken for group merging and the amount of argument storage required for the final matrix. The threshold should be increased exponentially after a certain point, because small changes in the threshold do not reduce the group count much when the threshold is large.

The algorithm for compressing a matrix into this format involves the following steps: 1. Produce the delta values for the matrix's index data, leaving the first element in each row unchanged. 2. Find the smallest acceptable interval for each delta value. 3. Split these interval choices into groups, being sure not to split a single group across multiple matrix rows. 4. Create a set of all groups used for the matrix, and how many times each was used. 5. Merge pairs of groups until an acceptable number is reached, using the algorithm above. 6. Generate the final list of groups and decompression code (done within the group merging algorithm). 7. Find the best group from the final list for each group-sized chunk of the matrix, and encode its index within the final group list and argument words (based on the computed delta values) into two arrays. 8. Append a special indicator value to the end of the group index array to indicate the end of the matrix.

Figure 4:
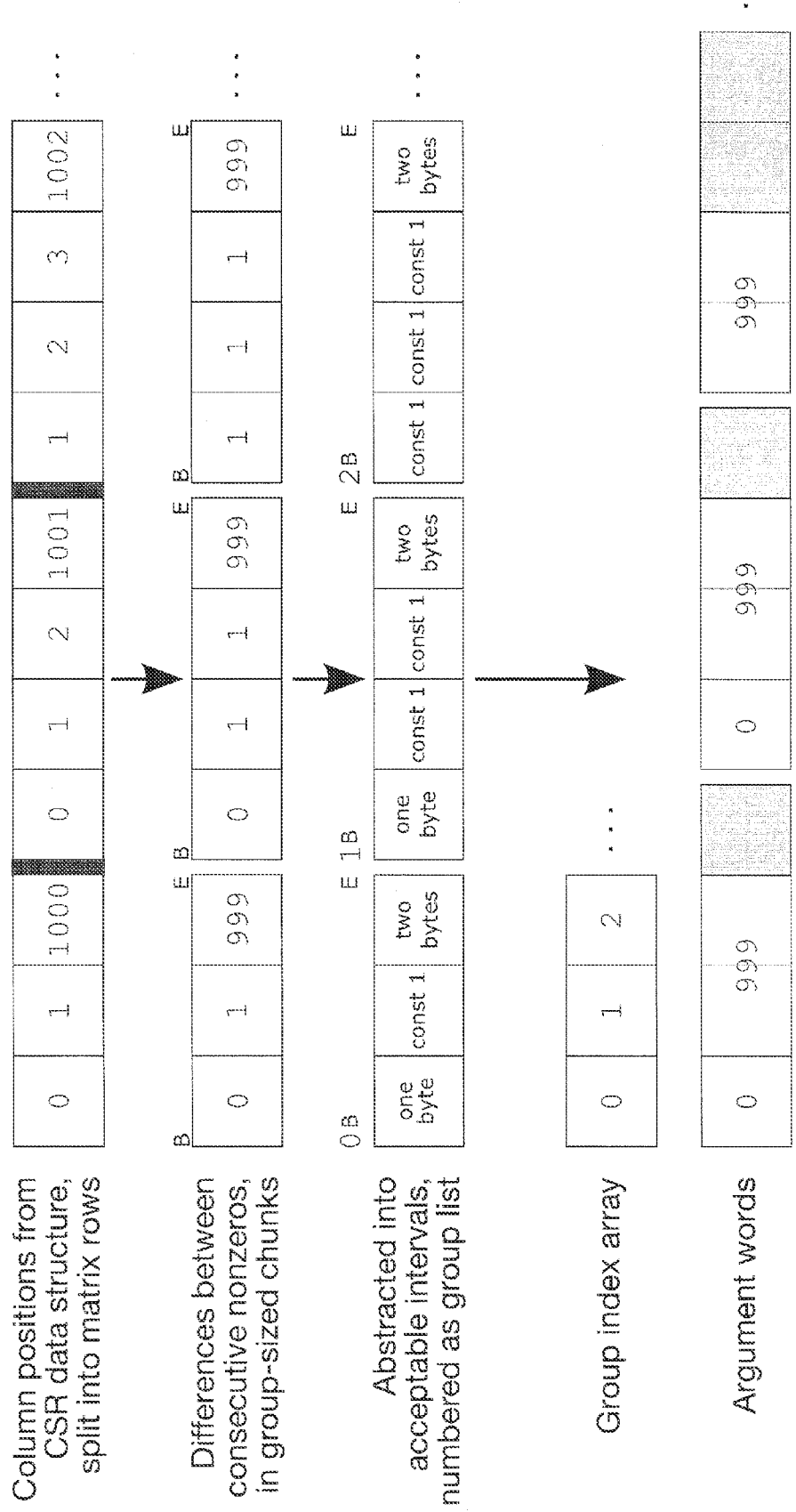
FIG. 4 is a schematic diagrammatic data model view showing the beginning of the pattern of the bwm2000 matrix, showing the compression process from CSR form to RPCSR form.

Producing the delta values and the smallest acceptable interval for each may be done easily, as the number of acceptable intervals is small. A sequence of tests may be used to check each delta value against the intervals in increasing order by size, stopping when a containing interval is found. Separating this data into group-sized chunks is also easy, as the maximum length of a group is constant and groups cannot be split across rows. In case of an empty row, a group of length zero may be produced in this process. Finding duplicate groups and occurrence counts for each may be slow, but a hash table or similar data structure may be used to speed up this process. Merging groups and generating code for them is done in a single algorithm; the overall pseudocode for this is above, and details of code generation are given below. The final encoding of the matrix index data is straightforward, but would also benefit from fast data structures for finding the best group for each chunk of the matrix. FIG. 4 shows the conversion process for a simple matrix; in this example, each group encompasses an entire matrix row and there are few enough groups that merging is not necessary.

The generated decompression code is fairly straightforward, in contrast to the intricate compression process. Two registers are used for the current row and column number within the matrix, both initialized to zero. The code reads each group index from the group index array, stopping when it sees the special end-of-matrix value. Otherwise, a jump table is used to go to the code for the indexed group. For each group, the code loads the correct number of argument words from the argument array, and extracts the argument for each element in the group from these words. Once the arguments are extracted, the starting value of each interval in the group is added to each one, and these are successively added to the current column number to produce the positions of matrix elements. These positions are then used, in combination with the loaded matrix element values, to multiply the group's portion of the matrix by the input vector.

The compression code used for testing this format is in portable C++, with some performance optimization applied to reduce compression times; the routines to produce the decompression and multiplication code for each matrix are specific to each processor. The PowerPC code generator produces raw instructions in machine code; after being produced, they may be called directly as a multiplication subroutine. The Opteron code generator currently produces assembly language in text form in a file; the system assembler is used to assemble this code into a shared library, and diopen( ) is used to load it into memory. After loading, the newly created procedure may be used for matrix-vector multiplication, just as in the PowerPC case. A C code generator is also implemented, but standard compilers appear to be too slow to make this path a viable option for high-performance code. Compression times tend to be large when a C program must be compiled as part of the process, and the highly stereotyped decompression code is relatively easy to generate as assembly or machine code.

In the current implementation, loading and decoding the argument words is done incrementally. Bit field operations are used for this on PowerPC, and partial register access, along with shifting and masking when partial registers cannot be used, are used on Opteron. Standard performance-enhancing techniques commonly used in CSR matrix-vector multiplication code are also used in the generated code, such as using multiple accumulators for each element of the output array, and using a reduction tree to combine these accumulators into the final element value.

Compression ratios and empirical performance results for this form of compression are given in Tables 4 and 5. Because the conditions for ending group merging vary between different processors, the compression ratios on the Opteron are usually slightly higher than those on the PowerPC 970. This algorithm provides a multiplication performance improvement for all matrices on both platforms, but may require a large amount of compression and code generation time to achieve this. In particular, the nd12k and nd24k matrices have very large compression times on both platforms. Another interesting feature of the performance results is that RPCSR does not necessarily give a better compression ratio than DCSR. Again, the nd12k and nd24k matrices are examples of this: their compression ratios and performance are both better with DCSR than with RPCSR. The likely explanation for this is that DCSR has a fixed encoding for difference values, and thus matrices which compress poorly just have large differences taking several bytes to encode. On the other hand, RPCSR takes fixed groups of 32 nonzero elements (or the rest of a row, whichever is smaller), and then must combine groups until a small enough number remain.

Thus, a matrix which compresses poorly in this scheme will have many initial patterns, requiring aggressive merging to reduce. This merging will then greatly increase the size of the argument array, because pattern merging cannot currently split a pattern into two shorter patterns to abstract common elements of several patterns. Thus, the adaptability of RPCSR, which allows very good index compression on some matrices, becomes a serious disadvantage on matrices with irregular structure.

Other compression techniques have also been explored. One, in particular, is to find regions of nearby elements in a row, but where not all of the intervening elements are nonzero. Then, the information about which elements are present may be encoded in a bit vector, which is much smaller than listing the element indices themselves. This format seems to be difficult to decompress quickly, although more work may solve this problem. Compressing the data values themselves in various ways has also been examined, such as trying to find data values which are exactly zero, or which are equal to each other; this possibility was not explored in too much depth. Some practical matrices may have such redundancies, however, in which case compressing the element values as well as the indices may be useful.

Converting each matrix into 256×256 blocks, and then finding various patterns (such as lines and small dense blocks) within the blocks was also explored. For this, lines with various strides in each direction were examined, including "dotted lines" such as one that consists of matrix elements with a column difference of 2 and a row difference of 1. This scheme produced performance improvements on some matrices, but was not beneficial in general. Also, compressing a matrix using this algorithm was very slow. Although we did not find a benefit from this kind of compression, others have explored similar algorithms and found some benefit (See P. M. W. Knijnenburg and H. A. G. Wijshoff. "On improving data locality in sparse matrix computations" Technical report, Leiden Institute of Advanced Computer Science, 1994). This work is also concerned primarily about memory locality, not minimization of memory traffic as in our work.

Another algorithm that was tried was intended to take advantage of the AltiVec vector unit in some PowerPC processors to speed up decompression. Instead of encoding the differences between the column numbers of consecutive non-zero elements in the matrix, the low parts of the column numbers were stored directly. Only the low bytes which differed between consecutive nonzeros were stored in an argument vector; an index of which low bytes were stored was given in a separate vector. This format may be decompressed rather easily using the AltiVec vector unit: a list of possible patterns of low bytes is stored, and a rearrangement of the bytes from the argument vector back into full column numbers may be pregenerated. This rearrangement, in the form of a permutation vector, may then be applied quickly by the processor. However, getting these decompressed column numbers back into the processor's integer unit so they may be used as indices to load floating point values was difficult, and this compression algorithm did not seem to produce performance improvements in most cases.

Other techniques anticipated include several traditional data compression techniques. The problem with using them is that they frequently involve either multiple memory lookups to decompress, or are otherwise slow. The main goal of the compression used here is to decompress the data faster than it could be read in from main memory, and so a very fast decompression algorithm is needed; the special-purpose formats and algorithms described here fulfill that need. Given the possibility of implementation in hardware (using an FPGA, for example), other, more standard and more effective compressed formats could likely be used. Using a vector processor (such as the AltiVec instruction set in some PowerPC processors) for some or all of the decompression process could also allow more complex algorithms to be used.

The present invention has several particular embodiments addressing particular problems. Memory bandwidth has long been known to be a performance limitation in scientific computing. One way to reduce the amount of memory bandwidth required is to compress data by storing it using less precision. This has been done with preconditioning matrices, in particular, as their precision is not as important to the solution of the underlying problem. Reduced precision cannot usually be used for most of the data in a problem, however, and does nothing about the index data of the preconditioning matrix. Standard approaches to reducing sparse matrix storage requirements, and thus increasing multiplication performance, include formats such as compressed sparse row/column. The compressed sparse row/column (CSR/CSC) formats for matrices store one word (usually four bytes) of index data for each nonzero element of the matrix, and one word for each row or column, in addition to the uncompressed data for the elements of the matrix. This format requires less storage than storing all of the coordinates of the nonzero matrix elements, but requires more storage than the technique described in this disclosure. For some applications, these formats are slightly modified by storing the matrix's main diagonal as a separate vector; this is called modified sparse row/column (MSR/MSC). These formats, along with corresponding versions for matrices with dense blocks, are the most common approaches used for storing sparse matrices in practice, and the performance comparisons achieved by the present invention give performance improvements relative to matrix-vector multiplication using a matrix in CSR format (or MSR format for symmetric matrices).

One known approach for reducing matrix-vector multiplication times is to compile the matrix pattern into machine code. Such as approach is useful because it allows branches and other control flow information given as part of the matrix pattern to be resolved earlier; also, reuse of the same (or nearby) vector elements may be found, further increasing performance. The matrix compression technique of the present invention was inspired by matrix compilation, but that work usually has the disadvantage of increasing the memory bandwidth requirement for the multiplication; the instructions to multiply a matrix element by its corresponding vector element are often longer than an uncompressed encoding of the element's location. However, the techniques of the present invention allow common matrix patterns to be found and compiled in a more efficient form. The adaptive compression scheme of the present invention employs code generation, but does not directly encode the structure of the matrix in the generated code; thus, it generates a relatively small decompression program along with a customized matrix representation for it to use, allowing a reduction in total memory traffic.

Another, somewhat related, technique for matrix-vector multiplication optimization is register blocking (e.g., as disclosed in E.-J. Im, K. Yelick, and R. Vuduc "Sparsity: Optimization Framework for Sparse Matrix Kernels" International Journal of High Performance Computing Applications, 18(1):135-158, 2004). This technique involves finding small dense blocks within the matrix. These may be represented using less space and may be multiplied by vectors faster than fully sparse parts of the pattern. This reduces the amount of index data that must be stored.

In some cases, elements whose value is zero are added into the matrix to "fill in" a dense block when almost all of a block is present in the matrix pattern. These extra zero elements require eight bytes each (a double-precision floating point value) in memory, increasing the required main memory traffic. This disadvantage was previously noted by Toledo (See S. Toledo "Improving the memory-system performance of sparse-matrix vector multiplication" IBM Journal of Research and Development, 41(6):711-725, 1997). The technique of the present invention does not include register blocking, but the compression schemes given here employ forms of run-length encoding which give high levels of compression for dense blocks.

Cache blocking is known to have been used for sparse matrix-vector multiplication. This technique involves rearranging the elements of the matrix to increase the locality of memory accesses to the vectors; the increased cache hit rates then increase performance. This technique does not decrease the memory bandwidth required. The Sparsity code generation system automatically examines a sparse matrix to determine the optimal parameters for register blocking (See E.-J. Im, K. Yellick, and R. Vuduc "Sparsity: Optimization Framework for Sparse Matrix Kernels" International Journal of High Performance Computing Applications, 18(1): 135-158, 2004). It then generates customized, efficient code for matrix-vector multiplication. Sparsity may compute the optimal block sizes to use for the two optimizations, but will add zeros to the matrix to fill in register blocks. It also may generate special purpose code for multiplying the same matrix by several vectors at the same time, and for reducing the number of matrix elements loaded for multiplications by a symmetric matrix.

Mellor-Crummey and Garvin use a technique called unroll-and-jam to optimize the performance of matrix-vector products (See J. Mellor-Crummey and J. Garvin "Optimizing Sparse Matrix-Vector Product Computations Using Unroll and Jam" International Journal of High Performance Computing Applications, 18(2):225-236, 2004). They group the rows of a sparse matrix by the number of nonzero elements in each, allowing more regular loop behavior. In particular, their algorithm, for each row length appearing in the matrix, interleaves floating-point operations from multiplying each row with that length. This interleaving involves many independent computations, easing instruction scheduling. D'Azevado, Fahey, and Mills also use a similar procedure, but use a permutation vector to rearrange the matrix rows logically without changing the storage of the numerical data (See E. D'Azevado, M. Fahey, and R. Mills "Vectorized sparse matrix multiply for compressed row storage format" in International Conference on Computational Science, 2005). White and Sadayappan sort the rows of the matrix by number of entries as well, from greatest to least (See J. White and P. Sadayappan "On improving the performance of sparse matrix-vector multiplication" in $4^{th}$ International Conference on High Performance Computing, pages 578-587, 1997). They then do a similar kind of operation interleaving as is done by unroll-and-jam, and may additionally rearrange the matrix elements for rows with the same length to keep matrix access sequential despite the changes to the operation sequence.

Several other techniques have also been used to improve the performance of sparse matrix-vector multiplication without reducing the amount of memory bandwidth used. One example of such an ad-hoc improvement is disclosed in U.S. Pat. No. 6,243,734, which does not appear to be published elsewhere. This modification involves a small change to the CSR data structure and corresponding multiplication algorithm to reduce the number of branches used in matrix-vector multiplication. This change to the algorithm does not affect the amount of memory bandwidth necessary, however.

Overall, previous matrix-vector multiplication performance improvements are usually based on changing the algorithm used for the multiplication in ways that do not usually reduce the memory bandwidth required, and sometimes even increase it. Instead, performance increases come from reducing the number of branches needed, or from increasing the cache hit rates for loads of vector data. On the other hand, the techniques of the present invention may increase the number of branches used, but make up for this by reducing the amount of main memory traffic needed.

Pinar and Heath compress the index data of a matrix using run-length encoding on adjacent matrix elements in the same row (see A. Pinar and M. T. Heath "Improving performance of sparse matrix-vector multiplication" In Proceedings of Supercomputing, 1999), providing a certain amount of compression to the index data, and also allowing a more efficient implementation of matrix-vector multiplication for matrices having many such contiguous elements. They also suggest permuting the matrix to increase the number of contiguous elements. The algorithms of the present invention include a form of run-length encoding, but without permuting elements. A similar form of run-length encoding was presented by Park, Draayer and Zheng (see S. C. Park, J. P. Draayer, and S.-Q. Zheng "An efficient algorithm for sparse matrix computations" In SAC '92: Proceedings of the 1992 ACM/SIGAPP symposium on Applied computing, pages 919-926, New York, N.Y., USA, 1992 ACM Press), but using two machine words to represent each run. The compressed format in that work only provides a space benefit when runs are long, and cannot compress matrices whose nonzero elements are close together but not contiguous.

Stathis et al present a high-performance compressed format for sparse matrices (see P. Stathis, S. Vassiliadis, and S. Cotofana "A hierarchical sparse matrix storage format for vector processors" In IPDPS '03: Proceedings of the 17th International Symposium on Parallel and Distributed Processing, page 61.1, Washington, D.C., USA, 2003. IEEE Computer Society). This format relies on a hierarchical decomposition of the matrix, using coordinate format to store the pattern of each block. This provides what is effectively a sparse quadtree matrix format, but with several levels of the quadtree flattened into a single data structure for performance. They provide simulated benchmark results for their new format, but this relies on a vector processor with custom extensions to directly process the compressed format. Comparisons are also to a vector processor, and no comparisons are given on common microprocessor architectures.

Many sparse matrices arise from the discretization of partial differential equations over a region of space. Meshes, either regular or irregular, are used to define the discretization of a geometric object. The pattern of the generated matrix then follows the connectivity structure of the mesh. Special-purpose algorithms for compressing meshes have been studied, such as by Isenburg and Gumhold (see M. Isenburg and S. Gumhold "Out-of-core compression for gigantic polygon meshes" ACM Trans. Graph., 22(3):935-942, 2003). The technique shown in that work is somewhat slow to decompress. Mesh compression techniques in general rely on particular information and properties related to meshes. On the other hand, the techniques in this disclosure accept matrices directly, without needing any extra information. It would probably be interesting to attempt to combine some mesh-compression techniques into a matrix compression algorithm, however.

Graphs are mathematical structures very similar to the patterns of sparse matrices. There is an isomorphism between sparse matrices and graphs with weighted edges, and so compression techniques for each kind of object may usually be used with the other. Blandford et al provide a special-purpose compression algorithm for graphs based on delta coding (See D. K. Blandford, G. E. Blelloch, and I. A. Kash "Compact representations of separable graphs" In Proc. ACM-SIAM Symposium on Discrete Algorithms, 2003; and D. K. Blandford, G. E. Blelloch, and I. A. Kash "An experimental analysis of a compact graph representation, 2004). Their compressed formats (several variants of the same basic idea are presented) are similar to the DCSR format presented here, but do not incorporate run-length encoding and do not group several control bits into a single byte to amortize branch costs. Blandford et al also present several algorithms for reordering the vertices of graphs to improve the compression ratio achieved; these reorderings may also benefit the compression algorithms in this disclosure. These reordering algorithms may be fairly expensive, and they are not essential to the compression technique.

Blandford et al have applied their compression techniques to reduce the memory bandwidth used for several graph algorithms, and have shown an improvement in performance.

Their experiments showed, however, that their compressed formats are not faster to use in algorithms than CSR on the Intel Pentium 4, suggesting that expensive conditional branches may cause their algorithms to lose performance.

Compressing particular graphs that represent the link structure of a set of Web pages has also been studied. These approaches are not generally for reducing the amount of data loaded from main memory into the processor, but for allowing larger graphs to be stored in memory rather than on disk. Boldi and Vigna discussed the WebGraph Framework's graph compression algorithm (See P. Boldi and S. Vigna "The WebGraph Framework J: Compression techniques" In World Wide Web Conference, pages 595-601. ACM Press, June 2004 at http://webgraph.dsi.unimi.it/). Their approach produces very high compression ratios by encoding not only the differences between the targets of successive links from the same source, but also runs of links to consecutive targets and the differences between the link structures of nearby pages with similar outgoing links. Thus, they achieve much better compression than the matrix compression algorithms in this disclosure, but at the cost of a much more expensive decompression process. Although their performance results are from implementations in Java, they suggest that the results will likely be the same in other languages. Therefore, their work is better for fitting large graphs into memory, but not for streaming data quickly from main memory to the processor and decompressing it in combination with another operation. Adler and Mitzenmacher also presented an earlier compression approach using only the differences between Web page outgoing links (See M. Adler and M. Mitzenmacher "Towards compressing Web graphs" In Data Compression Conference, pages 203-212, 2001).

Raghavan and Garcia-Molina use a hierarchical decomposition of a graph to produce smaller graphs which are more easily compressible (See S. Raghavan and H. Garcia-Molina "Representing Web graphs" In IEEE Intl. Conference on Data Engineering, March 2003). Suel and Yuan, on the other hand, disclose a compression algorithm which does not encode differences at all, but assigns a code to each Web page based on the number of links to it (See T. Suel and J. Yuan "Compressing the graph structure of the Web" In Data Compression Conference, pages 213-222, 2001).

Inverted indexes used for document search applications also are very large and have very sparse structures amenable to compression. The use of variable length coding of differences between successive stored elements appears to be common in that field. Inverted indexes are usually stored on disk (or would be if not compressed), however, and so more expensive compression techniques may be used for them than may be used for compressing sparse matrices in memory. Several techniques have been created to reorder the rows and/or columns of the index to improve its compressibility, as well as several application-specific compression techniques. Blandford and Blelloch devised a reordering algorithm to reduce the size of delta codes (See D. Blandford and G. Blelloch "Index compression through document reordering" In Data Compression Conference, pages 342-, 2002); this algorithm is the same as the one Blandford et al later applied to general graphs as discussed above. Other preordering strategies are known (See W.-Y. Shieh, T.-F. Chen, J. J.-J. Shann, and C.-P. Chung "Inverted file compression through document identifier reassignment" Information Processing & Management, 39(1):117-131, January 2003; and F. Silvestri, R. Perego, and S. Orlando "Assigning document identifiers to enhance compressibility of web search engines indexes" In ACM Symposium on Applied Computing, pages 600-605, New York, N.Y., USA, 2004. ACM Press). Scholer et al give another algorithm for compressing inverted indexes, also using variable-length encodings of numbers; they also show that compression provides performance benefits by reducing the amount of data loaded from main memory to the system caches (See F. Scholer, H. E. Williams, J. Yiannis, and J. Zobel "Compression of inverted indexes for fast query evaluation" In ACM SIGIR conference on Research and development in information retrieval, pages 222-229, New York, N.Y., USA, 2002. ACM Press). Vo and Moffat provide an alternative compression algorithm allowing faster random access to portions of the compressed index (See A. N. Vo and A. Moffat "Compressed inverted files with reduced decoding overheads" In ACM SIGIR conference on Research and development in information retrieval, pages 290-297, New York, N.Y., USA, 1998. ACM Press). Trotman surveys a number of techniques for index compression in (See A. Trotman "Compressing inverted files" Information Retrieval, 6(1):5-19, 2003).

Most of the inverted index compression schemes above compress each delta value separately and then concatenate them together. This contrasts to the compression schemes for matrix patterns in this disclosure, which group together the information affecting decompressor control flow from several delta values. The benefit of this approach is a decoding process requiring fewer conditional branches, which are expensive on many modern processors. One previous approach that included such a grouping is given in U.S. Pat. No. 6,057,790, which uses a variable-length encoding of each integer using fixed-size blocks (as is done by Blandford et al.), but with the additional feature of grouping the control bits for one encoded delta value together. This work does not seem to be grouping across delta values as the formats in this disclosure provide, however.

Database systems also use sparse bitmaps, although those systems appear to represent the bitmaps explicitly rather than as lists of element positions as is traditionally done for graphs and matrices. There have been a number of patents on compressed encodings for these bitmaps. U.S. Pat. Nos. 5,363,098, 5,908,927, and 6,205,442 disclose various byte-based algorithms which may run-length encode several all-zero or all-one bytes, but encode other bytes literally. U.S. Pat. No. 6,381,575 is for a wordcode-based extension of these ideas; this work is also described, along with a survey of previous bitmap compression schemes in the literature (See K. Wu, E. J. Otoo, and A. Shoshani "An efficient compression scheme for bitmap indices" Technical Report LBNL-49626, Lawrence Berkeley National Laboratory, April 2004 at http://repositories.cdlib.org/lbnl/LBNL-49626/).

General-purpose lossless data compression algorithms are normally used for text and software, and include algorithms such as Huffman encoding, arithmetic coding, LZ77, LZW, and the Burrows-Wheeler transform. These algorithms are not specifically targeted to compressing sparse matrix index data, and in particular are often difficult to decompress relative to the approach shown here. Such algorithms have been used to compress data in processor caches and in transit between main memory and caches to provide a performance increase due to reduced memory traffic, but usually are implemented in hardware for this purpose (for example, See E. G. Hallnor and S. K. Reinhardt "A compressed memory hierarchy using an indirect index cache" In Workshop on Memory Performance Issues, pages 9-15, New York, N.Y., USA, 2004. ACM Press). Data compression has also been used to speed transfers between a disk or network and a processor for improving algorithm performance, such as applying this technique to sorting problems (See J. Yiannis and J. Zobel "External sorting with on-the-fly compression" In A. James, B.

Lings, and M. Younas, editors, Proceedings of the British National Conference on Databases, pages 115-130, Coventry, UK, July 2003).

The present invention can also be used for multiplying the transpose of a matrix by a vector. The transpose of a matrix is a new matrix, formed by interchanging the row and column numbers of each element in the original matrix. For multiplying the transpose of a matrix by a vector, standard techniques can be used with the compressed formats in this disclosure. In particular, when a matrix element (row, col, value) is loaded from memory and decompressed, value can be multiplied by element row of the input vector, and the product then added to element col of the output vector. As matrix elements are decompressed in order by row, element row of the input vector can be stored in a processor register to avoid needing to reload it from memory for multiplication by each matrix element.

The present invention also applies to efficient storage of symmetric matrices. In a symmetric matrix, the matrix and its transpose are the same. This can be used to halve the amount of data which must be stored for the matrix, and also to halve the amount of this data which must be loaded into the processor from main memory. To do this, when the position and value of each nonzero element (row, col, value) of the matrix is loaded into the processor, it is treated as though it were two matrix elements (row, col, value) and (col, row, value). Thus, value is multiplied by elements row and col of the input vector, and these products are added into elements col and row of the output vector, respectively. As for transposed matrix-vector multiplication, element row of the input vector can be stored in a processor register and used for all matrix elements in that row. This approach to multiplying symmetric matrices by vectors is standard in the art, and is commonly used in multiplying symmetric matrices with one half stored in CSR format by vectors.

The present invention is also applicable to the PageRank algorithm. The PageRank algorithm (See Page, Brin, Motowani, and Winograd) is an algorithm for determining the relative importance of pages on the World Wide Web. The algorithm represents the links between web pages as a sparse adjacency matrix, which is typically extremely large. The algorithm itself is essentially a power method for computing the eigenvector corresponding to the largest eigenvalue of that adjacency matrix (see Kamvar, Haveliwala, Manning, and Golub, "Extrapolation methods for accelerating PageRank computations", Proceedings of the $12^{th}$ international conference on World Wide Web). The fundamental operation used in the computation is a matrix-vector product and can thus be accelerated by the approaches in the present invention.

The present invention includes two approaches to speeding up the multiplication of a sparse matrix by a dense vector by compressing the matrix's index information to reduce the memory bandwidth requirements of the multiplication process. This compression has been shown to cause an actual performance increase on several matrices representative of those used in practical applications, and on two common computing platforms. Also, the time used for compressing the matrix is often overwhelmed by the multiplication time savings when the same matrix (or matrices with the same pattern) is multiplied by many vectors by a higher-level algorithm.

Both compression schemes presented here have been shown to be beneficial on many matrices similar to those used in practical applications, but they present different tradeoffs between compression time and decompression/multiplication time. The simple delta-coding algorithm may produce a worse compression ratio than the more sophisticated adaptive algorithm, but has a minimal compression time (often near the time taken by four to five CSR matrix-vector multiplications by the same matrix). The compression times for the adaptive algorithm may be much higher, but it may provide improved multiplication performance on more matrices. Most users will likely benefit from the simpler algorithm, although the more sophisticated one is necessary in some cases; also, more general versions of the adaptive algorithm may achieve very high compression ratios on highly structured matrices.

Although the disclosed embodiments of the compression and decompression algorithms were able to get major performance improvements, a large amount of implementation effort was necessary for good performance. In particular, the compilers used appear to have some problems with the branch-heavy code used for decompression, and also with things such as extracting column difference values from bit fields within a word and then using them for indexing into an array. Thus, assembly code or non-portable pointer arithmetic were often required to get optimal decompression performance. Luckily, both architectures used for testing have dynamic instruction scheduling, and so little instruction reordering was necessary when generating assembly code. Also, the decompression and multiplication routines for both compression schemes are fairly regular, and so simple forms of automatic code generation could be used to generate these routines.

The matrix compression techniques of the present invention are also effective when larger matrix indices or other types for numerical values are used. When moving to 64-bit integers for row and column numbers in matrices, the amount of space used by CSR for index data doubles. The memory traffic required for index data in matrix-vector multiplication consequently also doubles. The compressed formats do not share this explosion in size: element locality will likely be similar, and there will be a few high bytes of a 64-bit index which are always zero. Thus, compression will be even more effective when larger index sizes are used. If the size of numerical values increases, on the other hand, compression will provide less benefit. Using complex numbers, quaternions, or dense matrix blocks as matrix values will cause this. In this case, index data will form a smaller part of the total memory traffic, and so reductions in index data size will not affect performance as much. Also, computations on the larger values will likely take longer, so memory bandwidth may not be as much of a limitation as with double-precision real values. Moving to smaller numerical values, such as single precision, has the opposite effect: index data will be a larger part of the overall memory traffic, so compression will provide a greater benefit. In the extreme case, there may not be any explicitly stored numerical values at all; the PageRank algorithm and other spectral algorithms on graphs are examples of this. In these cases, compression will be even more beneficial, as input and output vectors and the index data form all main memory traffic.

The present invention may also be implemented to improve the performance of the decompression code on other platforms, and possibly to implement software to automatically generate and tune compression and decompression code with less human intervention. Also, implementing compression and decompression in a more pre-packaged, easier-to-use form is also contemplated. Using these compressed formats to represent graphs, such as by adding the formats as graph data structures in the Boost Graph Library, is also within the scope of the invention. This would provide an easier way to use the compressed formats for some purposes. For this to be useful, more flexible access to the compressed data must be provided and/or customized algorithms to take advantage of compressed graphs must be implemented.

Implementation of matrix compression methods (these or others) using dedicated hardware or an FPGA would likely also lead to an improvement in performance, although likely with a great implementation cost. Customized hardware would allow sophisticated compression algorithms to be used, and possibly even general-purpose data compression algorithms such as LZW: one major limit on compression ratios currently is that the decompression algorithms must be fast enough to run interleaved with a matrix-vector multiplication, with the loss in performance from extra steps in decompression outweighed by the reduction in memory traffic.

Extremely large sparse matrices are often processed using parallel computers. A parallel matrix-vector product algorithm typically involves decomposition of the matrix into pieces, the processing of which is assigned to separate processing elements so that the overall computation is performed concurrently by those processing elements. A parallel computer may be comprised of shared memory parallelism or distributed memory parallelism, or a combination of the two (a cluster of shared memory parallel computers). A parallel sparse matrix operation will consist of sequential sparse matrix operations performed by the processing elements (in conjunction with communication actions in the case of distributed memory parallelism). The present invention can be used to increase the performance of a parallel matrix vector product if it is used to effect the sequential portion of such an algorithm, as performed by individual processing elements.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

Tables:

TABLE 1

Matrices used for testing, from the Matrix Market (http://math.nist.gov/MatrixMarket/) and the University of Florida sparse matrix collection (http://www.cise.ufl.edu/research/sparse/matrices/)

| Matrix | Symmetry | Rows | Cols | NNZ | Structure |
|---|---|---|---|---|---|
| cage 12 | N | 130,228 | 130,228 | 2,032,536 |  |
| cage 13 | N | 445,315 | 445,315 | 7,479,343 |  |

TABLE 1-continued

Matrices used for testing, from the Matrix Market (http://math.nist.gov/MatrixMarket/) and the University of Florida sparse matrix collection (http://www.cise.ufl.edu/research/sparse/matrices/)

| Matrix | Symmetry | Rows | Cols | NNZ | Structure |
|---|---|---|---|---|---|
| cage 14 | N | 1,505,785 | 1,505,785 | 27,130,349 |  |
| cfd2 | Y | 123,440 | 123,440 | 1,605,669 |  |
| e40r5000 | N | 17,281 | 17,281 | 553,956 |  |
| ldoor | Y | 952,203 | 952,203 | 23,737,339 |  |
| lhr71 | N | 70,304 | 70,304 | 1,528,092 |  |
| lhr71c | N | 70,304 | 70,304 | 1,528,092 |  |
| li | N | 22,695 | 22,695 | 1,350,309 |  |
| nasasrb | Y | 54,870 | 54,870 | 1,366,097 |  |
| nd12k | Y | 36,000 | 36,000 | 7,128,473 |  |
| nd24k | Y | 72,000 | 72,000 | 14,393,817 |  |
| pre2 | N | 659,033 | 659,033 | 5,959,282 |  |
| pwtk | Y | 217,918 | 217,918 | 5,926,171 |  |
| rim | N | 22,560 | 22,560 | 1,014,951 |  |
| s3dkt3ms2 | Y | 90,449 | 90,449 | 1,921,955 |  |
| scircuit | N | 170,998 | 170,998 | 958,936 |  |
| stomach | N | 213,360 | 213,360 | 3,021,648 |  |
| twotone | N | 120,750 | 120,750 | 1,224,224 |  |
| xenon2 | N | 157,464 | 157,464 | 3,866,688 |  |

TABLE 2

| Matrix | NNZ | Index emp. | Total emp. | Exp. spd. | Speedup | Tradeoff |
|---|---|---|---|---|---|---|
| cage12 | 2,032,536 | 56.02% | 19.45% | 17.28% | −0.31% | Never |
| cage13 | 7,479,343 | 52.84% | 18.30% | 16.39% | −4.76% | Never |
| cage14 | 27,130,349 | 48.59% | 16.78% | 15.13% | −11.65% | Never |
| cfd2 | 1,605,669 | 79.32% | 27.76% | 24.14% | 11.85% | 32 |
| e40r5000 | 553,956 | 86.37% | 29.38% | 27.67% | 29.53% | 16 |
| ldoor | 23,737,339 | 84.31% | 28.84% | 26.73% | 6.65% | 38 |
| lhr71 | 1,528,092 | 83.24% | 28.59% | 26.21% | 21.43% | 18 |
| lhr71c | 1,528,092 | 83.24% | 28.59% | 26.21% | 20.56% | 19 |
| li | 1,350,309 | 83.78% | 28.24% | 27.33% | 21.65% | 25 |
| nasasrb | 1,366,097 | 86.39% | 29.56% | 27.39% | 20.47% | 20 |
| nd12k | 7,128,473 | 88.54% | 29.61% | 29.32% | 11.44% | 30 |
| nd24k | 14,393,817 | 88.42% | 29.57% | 29.28% | 11.41% | 30 |

TABLE 2-continued

| Matrix | NNZ | Index emp. | Total emp. | Exp. spd. | Speedup | Tradeoff |
|---|---|---|---|---|---|---|
| pre2 | 5,959,282 | 55.79% | 19.92% | 16.42% | −0.49% | Never |
| pwtk | 5,926,171 | 86.86% | 29.66% | 27.65% | 17.48% | 18 |
| rim | 1,014,951 | 83.16% | 28.13% | 26.94% | 21.09% | 24 |
| s3dkt3m2 | 1,921,955 | 86.96% | 29.88% | 27.35% | 20.35% | 16 |
| scircuit | 958,936 | 63.26% | 23.45% | 17.55% | −3.44% | Never |
| stomach | 3,021,648 | 74.90% | 26.11% | 22.95% | 15.98% | 31 |
| twotone | 1,224,224 | 64.69% | 22.93% | 19.26% | 4.52% | 118 |
| xenon2 | 3,866,688 | 84.93% | 29.07% | 26.90% | 24.06% | 19 |

TABLE 3

| Matrix | NNZ | Index emp. | Total emp. | Exp. spd. | Speedup | Tradeoff |
|---|---|---|---|---|---|---|
| cage12 | 2,032,536 | 56.02% | 19.45% | 17.28% | −2.01% | Never |
| cage13 | 7,479,343 | 52.84% | 18.30% | 16.39% | −3.93% | Never |
| cage14 | 27,130,349 | 48.59% | 16.78% | 15.13% | −6.07% | Never |
| cfd2 | 1,605,669 | 79.32% | 27.76% | 24.14% | 24.69% | 19 |
| e40r5000 | 553,956 | 86.37% | 29.38% | 27.67% | 31.23% | 18 |
| ldoor | 23,737,339 | 84.31% | 28.84% | 26.73% | 19.27% | 18 |
| lhr71 | 1,528,092 | 83.24% | 28.59% | 26.21% | 16.97% | 29 |
| lhr71c | 1,528,092 | 83.24% | 28.59% | 26.21% | 17.02% | 29 |
| li | 1,350,309 | 83.78% | 28.24% | 27.33% | 11.40% | 49 |
| nasasrb | 1,366,097 | 86.39% | 29.56% | 27.39% | 31.46% | 14 |
| nd12k | 7,128,473 | 88.54% | 29.61% | 29.32% | 16.48% | 25 |
| nd24k | 14,393,817 | 88.42% | 29.57% | 29.28% | 14.65% | 27 |
| pre2 | 5,959,282 | 55.79% | 19.92% | 16.42% | −0.03% | Never |
| pwtk | 5,926,171 | 86.86% | 29.66% | 27.65% | 31.88% | 13 |
| rim | 1,014,951 | 83.16% | 28.13% | 26.94% | 16.34% | 37 |
| s3dkt3m2 | 1,921,955 | 86.96% | 29.88% | 27.35% | 34.26% | 12 |
| scircuit | 958,936 | 63.26% | 23.45% | 17.55% | 6.14% | 67 |
| stomach | 3,021,648 | 74.90% | 26.11% | 22.95% | 14.40% | 40 |
| twotone | 1,224,224 | 64.69% | 22.93% | 19.26% | 5.03% | 117 |
| xenon2 | 3,866,688 | 84.93% | 29.07% | 26.90% | 13.07% | 39 |

TABLE 4

| Matrix | NNZ | Index emp. | Total emp. | Exp. spd. | Speedup | Tradeoff |
|---|---|---|---|---|---|---|
| cage12 | 2,032,536 | 56.93% | 19.77% | 17.57% | 21.46% | 418 |
| cage13 | 7,479,343 | 48.67% | 16.85% | 15.09% | 17.78% | 1116 |
| cage14 | 27,130,349 | 40.58% | 14.02% | 12.64% | 14.04% | 4089 |
| cfd2 | 1,605,669 | 81.66% | 28.58% | 24.85% | 24.65% | 133 |
| e40r5000 | 553,956 | 92.34% | 31.41% | 29.59% | 39.03% | 31 |
| ldoor | 23,737,339 | 87.82% | 30.04% | 27.84% | 21.14% | 56 |
| lhr71 | 1,528,092 | 90.27% | 31.00% | 28.42% | 32.92% | 43 |
| lhr71c | 1,528,092 | 90.27% | 31.00% | 28.42% | 32.12% | 44 |
| li | 1,350,309 | 88.84% | 29.94% | 28.97% | 32.11% | 150 |
| nasasrb | 1,366,097 | 89.80% | 30.72% | 28.47% | 22.75% | 66 |
| nd12k | 7,128,473 | 70.30% | 23.51% | 23.28% | 8.69% | 70450 |
| nd24k | 14,393,817 | 68.44% | 22.89% | 22.66% | 16.64% | 64605 |
| pre2 | 5,959,282 | 65.78% | 23.48% | 19.36% | 21.52% | 96 |
| pwtk | 5,926,171 | 91.25% | 31.15% | 29.04% | 25.78% | 46 |
| rim | 1,014,951 | 93.89% | 31.76% | 30.41% | 32.52% | 58 |
| s3dkt3m2 | 1,921,955 | 93.14% | 32.01% | 29.29% | 25.11% | 34 |
| scircuit | 958,936 | 56.68% | 21.01% | 15.72% | 20.27% | 310 |
| stomach | 3,021,648 | 79.08% | 27.57% | 24.23% | 28.07% | 203 |
| twotone | 1,224,224 | 72.29% | 25.63% | 21.52% | 27.43% | 95 |
| xenon2 | 3,866,688 | 87.94% | 30.10% | 27.86% | 32.96% | 100 |

TABLE 5

| Matrix | NNZ | Index emp. | Total emp. | Exp. spd. | Speedup | Tradeoff |
|---|---|---|---|---|---|---|
| cage12 | 2,032,536 | 57.64% | 20.02% | 17.79% | 16.03% | 768 |
| cage13 | 7,479,343 | 50.49% | 17.48% | 15.66% | 11.71% | 1931 |
| cage14 | 27,130,349 | 42.96% | 14.84% | 13.38% | 8.27% | 8081 |
| cfd2 | 1,605,669 | 82.16% | 28.76% | 25.01% | 29.93% | 327 |
| e40r5000 | 553,956 | 92.31% | 31.40% | 29.58% | 30.54% | 162 |
| ldoor | 23,737,339 | 88.50% | 30.28% | 28.06% | 17.27% | 136 |
| lhr71 | 1,528,092 | 90.26% | 31.00% | 28.42% | 15.52% | 126 |
| lhr71c | 1,528,092 | 90.26% | 31.00% | 28.42% | 15.49% | 131 |

TABLE 5-continued

| Matrix | NNZ | Index emp. | Total emp. | Exp. spd. | Speedup | Tradeoff |
|---|---|---|---|---|---|---|
| li | 1,350,309 | 89.38% | 30.13% | 29.15% | 18.78% | 842 |
| nasasrb | 1,366,097 | 90.62% | 31.01% | 28.73% | 34.94% | 779 |
| nd12k | 7,128,473 | 73.26% | 24.50% | 24.26% | 10.95% | 57481 |
| nd24k | 14,393,817 | 74.00% | 24.75% | 24.50% | 4.78% | 206941 |
| pre2 | 5,959,282 | 65.93% | 23.54% | 19.40% | 10.31% | 259 |
| pwtk | 5,926,171 | 92.09% | 31.44% | 29.31% | 32.01% | 275 |
| rim | 1,014,951 | 93.85% | 31.75% | 30.40% | 23.45% | 311 |
| s3dkt3m2 | 1,921,955 | 93.13% | 32.00% | 29.29% | 34.86% | 57 |
| scircuit | 958,936 | 56.64% | 21.00% | 15.71% | 13.11% | 615 |
| stomach | 3,021,648 | 79.07% | 27.57% | 24.23% | 22.54% | 319 |
| twotone | 1,224,224 | 72.25% | 25.62% | 21.51% | 20.47% | 257 |
| xenon2 | 3,866,688 | 87.92% | 30.09% | 27.85% | 29.05% | 169 |

What is claimed is:

1. A method of improving the processing of sparse matrices by a computer system having a limited memory bandwidth, a processor capable of compressing and decompressing data, and a computer readable storage medium that can be used in connection with the processor, the method comprising:
applying, using the processor, a compression algorithm to compress row index data and column index data of a sparse matrix, the compression algorithm including generating command codes and argument bytes for the matrix,
inserting a first command code between rows of the matrix,
for each low of the matrix, processing groups of up to four adjacent non-zero elements by encoding a position difference between adjacent groups as argument bytes, using a second command code for an argument greater than one byte corresponding to a size of the groups, and
packing the command codes and argument bytes into words including three command codes per word;
storing the compressed row and column index data of the sparse matrix; and
accessing, using the processor, the sparse matrix using a merged decompression/matrix-vector multiplication algorithm on the compressed index data and a vector.

2. The method of claim 1, wherein processing involves document ranking.

3. The method of claim 2, wherein document ranking uses a PageRank algorithm.

4. The method of claim 1, wherein the matrix represents a graph.

5. The method of claim 1, wherein processing involves solving a linear system of equations.

6. The method of claim 1, wherein processing involves decomposition of the sparse matrix into pieces, assignment of processing of the pieces to separate processing elements, and concurrent overall computation by the processing elements to define a sequential portion of a parallel sparse matrix operation.

7. The method of claim 1, wherein the sparse matrix represents a mesh representing the geometry of one or more objects.

8. The method of claim 1, wherein the compression algorithm uses run-length encoding for the non-zero elements.

9. The method of claim 1, wherein applying a compression algorithm includes generating indicator data having representations selected from the at least one of column index data and mw index data.

10. The method of claim 1, further including producing a new vector from a product of the matrix and the vector.

11. A non-transitory computer-readable storage medium storing instructions that, when executed by one or more processors in a device for compressing and decompressing sparse matrices having matrix index data with rows and columns, cause the processor to:
apply a compression algorithm to compress both the mw and column matrix index data of a sparse matrix, the compression algorithm including
generating command codes and argument bytes for the matrix,
inserting a first command code between rows of the matrix,
for each mw of the matrix, processing groups of up to four adjacent non-zero elements by encoding a position difference between adjacent groups as argument bytes, using a second command code for an argument greater than one byte and a third command code corresponding to a size of the groups, and
packing the command codes and argument bytes into words including three command codes per word;
store the matrix index data in the compressed format; and
use a merged decompression/matrix-vector multiplication algorithm on the compressed matrix index data and a vector to access the sparse matrix.

12. The non-transitory computer-readable storage medium of claim 11, wherein the instructions further cause the processor to process the sparse matrix using document ranking.

13. The non-transitory computer-readable storage medium of claim 12, wherein the ranking is uses a PageRank algorithm.

14. The non-transitory computer-readable storage medium of claim 11, wherein the sparse matrix represents a graph.

15. The non-transitory computer-readable storage medium of claim 11, wherein the instructions further cause the processor to process the sparse matrix by solving a linear system of equations.

16. The non-transitory computer-readable storage medium of claim 11, wherein the instructions further cause the processor to process the sparse matrix by decomposing the sparse matrix into pieces, assigning processing of the pieces to separate processing elements, and concurrently performing an overall computation by the processing elements to define a sequential portion of a parallel sparse matrix operation.

17. The non-transitory computer-readable storage medium of claim 11, wherein the sparse matrix represents a mesh representing the geometry of one or more objects.

18. The non-transitory computer-readable storage medium of claim 11, wherein each index data value is represented in the compressed matrix index data using one of a set of two or more encoding algorithms.

19. The non-transitory computer-readable storage medium of claim 11, wherein the compression algorithm uses run-length encoding for the non-zero elements.

20. The non-transitory computer-readable storage medium of claim 11, wherein applying a compression algorithm includes causing the processor to store indicator data for multiple row and/or column index data elements together within a single unit of storage, and wherein using a merged decompression/matrix-vector multiplication algorithm includes the processor using the indicator data for multiple row and/or column index data elements to choose a location to which to change a flow of instruction execution of the processor.

21. The method of claim 9, wherein applying a compression algorithm includes storing the indicator data for multiple row and/or column index data elements together within a single unit of storage, and wherein using a merged decompression/matrix-vector multiplication algorithm includes using the indicator data for multiple row and/or column index data elements to choose a location to which to change a flow of instruction execution of the processor.

22. The non-transitory computer-readable storage medium of claim 11, wherein the instructions further cause the processor to produce a new vector from a product of the matrix and the vector.

* * * * *

UNITED STATES PATENT AND TRADEMARK OFFICE
CERTIFICATE OF CORRECTION

PATENT NO. : 8,775,495 B2  
APPLICATION NO. : 11/673944  
DATED : July 8, 2014  
INVENTOR(S) : Andrew Lumsdaine et al.

It is certified that error appears in the above-identified patent and that said Letters Patent is hereby corrected as shown below:

In the Claims

Claim 1, Column 25, line 34, after the words "one byte" add --and a third command code--.

Claim 9, Column 25, line 65, change "mw" to row.

Signed and Sealed this  
Seventh Day of October, 2014

Michelle K. Lee  
*Deputy Director of the United States Patent and Trademark Office*